US008735772B2

(12) United States Patent
Chacin et al.

(10) Patent No.: US 8,735,772 B2
(45) Date of Patent: May 27, 2014

(54) METHOD AND APPARATUS FOR IMPROVED LASER SCRIBING OF OPTO-ELECTRIC DEVICES

(75) Inventors: Juan Chacin, San Jose, CA (US); Irving Chyr, Fremont, CA (US); Jonathan Halderman, Santa Clara, CA (US)

(73) Assignee: Electro Scientific Industries, Inc., Portland, OR (US)

( * ) Notice: Subject to any disclaimer, the term of this patent is extended or adjusted under 35 U.S.C. 154(b) by 491 days.

(21) Appl. No.: 13/031,232

(22) Filed: Feb. 20, 2011

(65) Prior Publication Data

US 2012/0211477 A1    Aug. 23, 2012

(51) Int. Cl.
*B23K 26/00*    (2006.01)
*H01L 21/00*    (2006.01)

(52) U.S. Cl.
USPC ..................................... 219/121.69; 438/460

(58) Field of Classification Search
USPC .................. 219/121.6–121.83; 438/460–462
See application file for complete search history.

(56) References Cited

U.S. PATENT DOCUMENTS

| 4,546,231 | A | * | 10/1985 | Gresser et al. | ........... | 219/121.72 |
| 5,063,280 | A | * | 11/1991 | Inagawa et al. | ............ | 219/121.7 |
| 6,300,593 | B1 | | 10/2001 | Powell | | |
| 6,580,054 | B1 | | 6/2003 | Liu et al. | | |
| 6,992,026 | B2 | | 1/2006 | Fukuyo et al. | | |
| 7,494,900 | B2 | | 2/2009 | Harris et al. | | |
| 7,804,043 | B2 | | 9/2010 | Deshi | | |
| 7,915,140 | B2 | * | 3/2011 | Genda et al. | ................... | 438/462 |
| 8,314,359 | B2 | * | 11/2012 | Bovatsek et al. | ........ | 219/121.64 |
| 2001/0035401 | A1 | | 11/2001 | Manor | | |
| 2004/0134894 | A1 | * | 7/2004 | Gu et al. | .................. | 219/121.68 |
| 2006/0220183 | A1 | | 10/2006 | Asai et al. | | |
| 2007/0235418 | A1 | * | 10/2007 | Park et al. | .................. | 219/121.6 |
| 2007/0272668 | A1 | | 11/2007 | Albelo et al. | | |
| 2007/0298529 | A1 | | 12/2007 | Maeda et al. | | |

OTHER PUBLICATIONS

International Search Report of PCT/US2012/024181, 2 pages, 2012.
Written Opinion of PCT/US2012/024181, 2 pages, 2012.

* cited by examiner

*Primary Examiner* — Sang Y Paik
(74) *Attorney, Agent, or Firm* — Haynes Beffel & Wolfeld LLP

(57) ABSTRACT

Disclosed are laser scribing systems for laser scribing semiconductor substrates with backside coatings. In particular these laser scribing systems laser scribe opto-electric semiconductor wafers with reflective backside coatings so as to avoid damage to the opto-electric device while maintaining efficient manufacturing. In more particular these laser scribing systems employ ultrafast pulsed lasers at wavelength in the visible region and below in multiple passes to remove the backside coatings and scribe the wafer.

22 Claims, 8 Drawing Sheets

METHOD AND APPARATUS FOR IMPROVED LASER SCRIBING OF OPTO-ELECTRIC DEVICES

TECHNICAL FIELD

The present invention relates to laser scribing opto-electric devices such as light-emitting diodes (LEDs) constructed on substrates such as sapphire wafers. In particular it relates to scribing opto-electric devices constructed on substrates having a backside coating such as a distributed Bragg reflector (DBR). In more particular it relates to laser scribing opto-electric devices constructed on substrates having backside coatings in multiple passes so as to prevent damage to the opto-electric devices or the substrate.

BACKGROUND OF THE INVENTION

Opto-electric devices such as light-emitting diodes are typically manufactured by making multiple identical copies of a device in parallel on a substrate. Substrates typically used to manufacture opto-electric devices include wafers of sapphire, gallium arsenide, indium phosphide, silicon, germanium, diamond, or ceramics. These substrates typically need to be singulated into individual devices. Singulation can be performed by first scribing the substrate with a diamond saw or laser. Scribing is defined as creating a modified region on the surface or within the volume of a substrate which facilitates cracking and thereby the separation of the substrate proximate to the scribe. U.S. Pat. No. 6,580,054 SCRIBING SAPPHIRE SUBSTRATES WITH A SOLID STATE UV LASER, inventors Kuo-Ching Liu, Pei Hsien Fang, Dan Dere, Jenn Liu, Jih-Chuang Huang, Antonio Lucero, Scott Pinkham, Steven Oltrogge, and Duane Middlebusher, issued Jun. 17, 2003 describes the basic process of scribing substrates to prepare them for singulation by cleaving, wherein scribed substrates are subjected to localized stress at the scribe location to create cracks in the substrate which propagate through the thickness of the substrate thereby separating the wafer along the scribe. Substrates are often adhesively attached to a die attach film or plastic sheet attached to a surrounding frame called a tape frame during singulation to keep the singulated devices in place in spite of being separated. Laser scribing is distinguished from laser dicing where the substrate is completely or nearly through cut with the laser or saw to perform singulation without the cleaving step.

Problems with laser scribing include selecting laser parameters to process materials with widely varying laser energy absorption characteristics, avoiding damage to substrates and devices and maintaining acceptable system throughput. Opto-electric devices are particularly difficult to laser scribe or dice because the performance of the device can be dependent upon the manner in which the device was singulated. In particular, some opto-electric devices are constructed with a backside coating which reflects stray light back out of the device thereby increasing the device output efficiency as measured in candelas per ampere. The article "Nitride-Based LEDs With a Hybrid Al Mirror+Tio2/Slo2 DBR Backside Reflector," authors S. J. Chang, C. F. Shen, M. H. Hsieh, C. T. Kuo, T. K. Ko, W. S. Chen and S. C. Shei, describes the construction of these types of opto-electric devices. Laser scribing techniques which cause an undesirable heat affected zone adjacent to the scribes can reduce device output efficiency, as can damage which causes the reflective coating to "lift-off" or separate from the substrate. U.S. Pat. No. 7,804,043 METHOD AND APPARATUS FOR DICING OF THIN AND ULTRA THIN SEMICONDUCTOR WAFER USING ULTRAFAST PULSE LASER, inventor Tan Deshi, issued Sep. 28, 2010, describes using ultrafast lasers to scribe wafers but does not consider the need to remove coatings such as a DBR. U.S. Pat. No. 6,992,026, LASER PROCESSING METHOD AND LASER PROCESSING APPARATUS, inventors Fumitsugu Fukuyo, Keshi Fukumitsu, Maoki Uchiyama and Toshimitsu Wakuda, issued Jan. 31, 2006 discusses damage to substrates caused by pulsed lasers while scribing. This patent teaches using laser beams focused deep within the substrate to create altered zones unconnected to either the frontside or backsides of the wafer to permit cleaving while preventing damage to the substrate. U.S. Pat. No. 7,494,900, BACKSIDE WAFER DICING, inventors Richard S. Harris and Ho W. Lo, issued Feb. 24, 2009, discusses the advantages of performing backside processing of substrates but does not discuss scribing in the presence of a coating nor does it discuss methods of preventing damage to the substrate while scribing. U.S. patent application Ser. No. 2006/0220183 SEMICONDUCTOR WAFER HAVING MULTIPLE SEMICONDUCTOR ELEMENTS AND METHOD FOR DICING THE SAME, inventors Makoto Asai, Muneo Tamura, Kazuhiko Sugiura and Tetsuo Fujii, published Oct. 5, 2006 describes a two step process for scribing wafers having two layers where the layers have different refractive indices with respect to the laser wavelength being used. This application discusses only frontside scribing rather than backside scribing and does not discuss applications where the layer to be processed does not have a refractive index, but is in fact opaque to the wavelengths in question. Further this application does not discuss ways to avoid damage to the singulated devices as a result of the laser energy applied.

There remains a continuing need for a laser scribing process that scribes the backside opto-electric device substrates with reflective coatings in an efficient fashion without damaging the substrate using ultrafast laser pulses.

SUMMARY OF THE INVENTION

Aspects of the present invention improve the scribing of opto-electric devices on a substrate in the presence of a backside coating by first removing the backside coating with a laser in the region to be scribed and then scribing the substrate. Using multiple passes with reduced the laser fluence per unit time to remove the backside coating or scribe the substrate can avoid damage to the substrate or nearby active circuitry. Opto-electric device substrates typically have a frontside having streets and a backside having a surface coating. This coating reflects stray light emitted by the device which would otherwise be absorbed and cause decreased light output and higher operating temperatures which reduce device lifetime. Aspects of the invention include a laser scribing system with an ultrafast pulsed laser having first and second laser pulse parameters. The laser scribing system removes the coating from backside of substrate in regions generally aligned with the frontside streets of the substrate using an ultrafast pulsed laser with first laser pulse parameters without causing substantial damage to said substrate. The laser scribing system then scribes the substrate in regions generally aligned with the frontside devices using an ultrafast pulsed laser with second laser pulse parameters.

Opto-electric devices such as light-emitting diodes are typically manufactured by making multiple identical copies of a device in parallel on a substrate. A typical substrate containing opto-electric devices is shown in FIG. 1. These substrates typically need to be singulated into individual devices. Singulation can be performed by first scribing the substrate with a diamond saw or laser along the streets between the devices. Opto-electric devices are typically constructed with active circuitry on the frontside surface and a backside coating which facilitates light output of the device. Scribing the wafer from the backside permits higher fluence laser pulses and therefore permits higher throughput without causing damage to the active circuitry. However, even laser pulses directed to the backside of the substrate can penetrate the substrate and cause damage on the frontside if the laser fluence is not carefully controlled. Laser fluence is defined as Joules/$cm^2$ and is a measure of the total energy per unit area applied to a substrate by a laser. Desirable properties for scribed opto-electric device would be to have clean, planar sidewalls with some texture caused by the laser scribe but no debris or redeposited material. The device would have an intact, cleanly scribed backside coating evenly attached to the device and no damage to the active circuitry on the frontside.

The laser used to scribe these substrates is an ultrafast pulsed laser with laser pulse duration of about 100 ps or less. Laser material removal is generally a mixture of thermal processes or ablative processes. Thermal processes are those where the material is heated and either melts, vaporizes or sublimates directly to a gas. Material is ejected from the area as a vapor, a liquid, or solid particles. Ablative processes alter the material through photo-electric interactions, typically multi-photon, which disassociates the material into plasma. Ultrafast pulses couple energy into the material and create plasma faster than the heat can substantially transfer to adjacent material, thereby creating alterations in the material while minimizing thermal effects which could cause undesirable damage to the substrate or device. The alteration of material may be totally within the surface of the substrate. It is not typically necessary to remove material or make a trench or other feature in the surface of the substrate to promote cracking and subsequent singulation. The material must merely be altered enough to promote and direct stress fractures in the material reliably.

Substrates are laser scribed using an adapted laser scribing system. Adaptations include fitting a laser operative to create laser pulses with the desired laser pulse parameters. These laser pulse parameters include wavelength, pulse energy, pulse duration, pulse repetition rate, focal spot size, focal spot location and beam speed. The laser scribing system generates laser pulses with a laser which emits pulses with selected pulse energy and pulse duration at a selected pulse repetition rate. The laser processing system uses laser optics which select and optionally shape the laser pulses spatially and temporally. The laser pulses are focused to a very small spot size in order to concentrate sufficient laser energy in a small enough area to alter the materials in a desirable fashion. The focal spot is defined as the point in space where the laser pulse has the smallest cross-section perpendicular to the direction of propagation of the pulses. The laser scribing system has motion control stages which precisely locate the focal spot a selected height above, below or at the surface of the substrate. The laser processing system also has a combination of beam steering optics and motion control stages which move the substrate in relation to the laser pulses as the laser is pulsing thereby removing or altering material in a pattern determined by the relative motion. The rate at which the laser pulses move relative to the substrate is called beam speed and is measured in millimeters per second. An exemplary laser scribing system which may be adapted to perform aspects of this invention is the AccuScribe 2600 LED Laser Scribing System, manufactured by Electro Scientific Industries, Inc., Portland, Oreg. 97239, shown in FIG. 2

Aspects of this invention scribe substrates by first attaching the substrate frontside to a tape frame with die attach film (DAF) and inserting the attached substrate into the system. The system aligns the substrate so as to be able to aim the laser to scribe the substrate on the backside while maintaining alignment with the streets on the frontside. Laser scribing systems typically process substrates by directing a pulsed laser beam to the substrate while moving the laser beam with respect to the wafer so as to cause the laser pulses to impact the substrate along a path determined by the speed and direction of the relative motion. For efficiency it is typically best to process the substrate in passes, where the system starts processing with the pulsed laser beam while moving the relative location of the laser beam with respect to the substrate in a relatively continuous fashion, typically starting once and stopping once per pass. Aspects of this invention scribe the substrate by making multiple linear passes on the backside of the substrate in orthogonal directions aligned with the frontside streets, although any pattern of curvilinear or straight lines can be scribed.

Aspects of this invention scribe substrates using one or more passes per scribe. In some instances, the thickness of the substrate and layout of active circuitry on the frontside permits enough laser fluence per unit time to be delivered to the substrate backside to remove the backside coating and form a scribe in a single pass. In most instances, however, applying enough laser energy to remove the backside coating and form a scribe in a single pass results in undesirable damage to the substrate or device. In this instance more than one pass is required with laser pulse parameters being altered depending upon whether the backside coating is being removed or the scribe is being formed. Aspects of this invention use one or more passes to remove the backside coating and then one or more passes to form the scribe.

Aspects of this invention determine laser pulse parameters which process the substrate efficiently without causing damage to the substrate or devices. Laser pulse parameters which may be determined include wavelength, pulse duration, pulse energy, laser power, pulse repetition rate, focal spot size, focal spot location and beam speed. These parameters are determined empirically for a particular substrate and device type to process the substrate with maximum throughput while avoiding damage to the substrate or devices.

Once the optimal laser pulse parameters are selected the number of passes is determined. Depending upon the laser energy permitted the backside coating may be removed in one pass as shown in FIGS. 3 and 4 or two or more passes may be required to remove the backside coating as shown in FIG. 7 or more complex patterns as shown in FIG. 8. FIG. 8 shows backside coating removal using linear motion combined with beam steering optics to remove backside coating in a complex pattern. In these cases two or more passes are made horizontally adjacent or in a serpentine pattern with the focal spot located above the surface of the backside coating to defocus the laser pulses slightly to reduce the fluence and increase the area processed so that sufficient backside coating is removed to permit scribing on a subsequent pass or passes. In other cases, once the backside coating is removed, a single pass or multiple passes may be required to scribe the substrate. In this case, two or more passes may be made along the same line horizontally but the focal spot location is changed to increase the depth within the substrate to which the laser pulses are focused in order to form the scribe without damage to the substrate or devices.

DETAILED DESCRIPTION OF EMBODIMENTS

Embodiments of the present invention improve the scribing of opto-electric devices on a substrate in the presence of a backside coating by first removing the backside coating with a laser in the region to be scribed and then scribing the substrate. Using multiple passes reduces the laser fluence per unit time and thereby avoids damage to the substrate or nearby active circuitry. Opto-electric device substrates typically have a frontside having streets and a backside having a surface having a coating. This coating reflects stray light emitted by the device which would otherwise be absorbed and cause decreased light output and higher operating temperatures which reduce device lifetime. Embodiments of this invention include a laser scribing system with an ultrafast pulsed laser having first and second laser pulse parameters. The laser scribing system removes the coating from backside of substrate in regions generally aligned with the frontside streets of the substrate using an ultrafast pulsed laser with first laser pulse parameters without causing substantial damage to said substrate. The laser scribing system then scribes the substrate in regions generally aligned with the frontside using an ultrafast pulsed laser with second laser pulse parameters.

Figure 1:
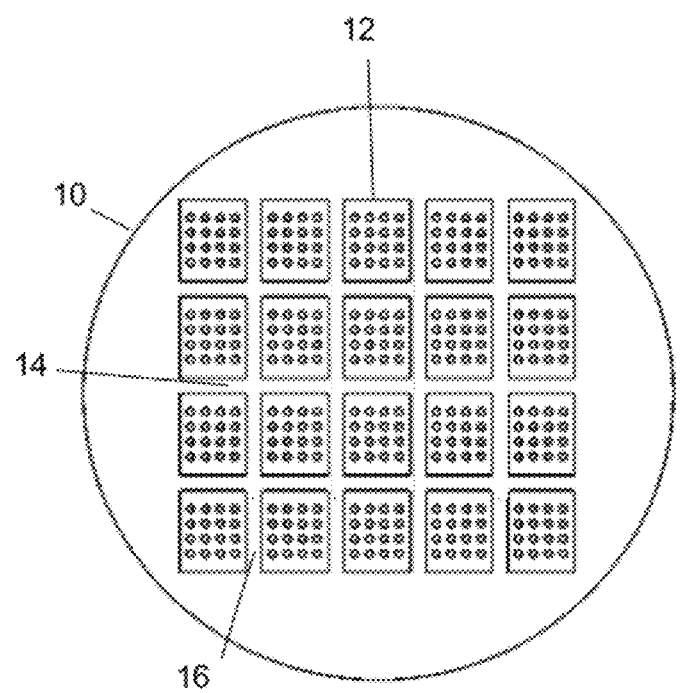
FIG. 1 (Prior art) A substrate containing opto-electric devices

Opto-electric devices such as light-emitting diodes are typically manufactured by making multiple identical copies of a device in parallel on a substrate. A typical substrate containing opto-electric devices is shown in FIG. 1. A wafer 10 has constructed on it several devices, one of which is indicated 12. These devices are separated by horizontal 14 and vertical 16 streets. The term street refers to areas of the substrate which does not contain active device circuitry. These streets are left free of active circuitry to permit the substrate to be scribed or diced to singulate the substrate into individual devices. Singulation can be performed by first scribing the substrate with a diamond saw or laser along the streets between the devices. Opto-electric devices are typically constructed with active circuitry on the frontside surface and a backside coating which facilitates light output of the device. Scribing the wafer from the backside permits higher fluence laser pulses and therefore permits higher throughput without causing damage to the active circuitry. However, even laser pulses directed to the backside of the substrate can penetrate the substrate and cause damage on the frontside if the laser fluence is not carefully controlled. Laser fluence is defined as Joules/cm$^2$ and is a measure of the total energy per unit area applied to a substrate by a laser. Desirable properties for scribed opto-electric device would be to have clean, planar sidewalls with some texture caused by the laser scribe but no debris or redeposited material. The device would have an intact, cleanly scribed backside coating evenly attached to the device and no damage to the active circuitry on the frontside.

The laser used to scribe these substrates is an ultrafast pulsed laser with laser pulse duration of about 200 ps or less. Laser material processing is generally a mixture of thermal processes or ablative processes. Thermal processes are those where the material is heated and either melts, vaporizes or sublimates directly to a gas. Material is ejected from the area as a vapor, liquid, or solid particles. Ablative processes alter the material through photo-electric interactions, typically multi-photon, which disassociates the material into plasma. Ultrafast pulses couple energy into the material and create plasma faster than the heat can substantially transfer to adjacent material, thereby creating alterations in the material while minimizing thermal effects which could cause undesirable damage to the substrate or device. The alteration of material may be totally within the surface of the substrate. It is not typically necessary to remove material or make a trench or other feature in the surface of the substrate to promote cracking and subsequent singulation. The material must merely be altered enough to promote and direct stress fractures in the material reliably.

Substrates are laser scribed using an adapted laser scribing system. Adaptations include fitting a laser operative to create laser pulses with the desired laser pulse parameters. These laser pulse parameters include laser power, wavelength, pulse energy, pulse duration, pulse repetition rate, focal spot size, focal spot location and beam speed. Laser power ranges from about 0.1 W to about 20 W, more preferably in the range from about 0.5 W to about 1.5 W. Wavelengths range from about 560 nm down to about 150 nm, or more preferably in the ultraviolet range at about 355 nm. The pulse energy ranges from about 0.1 µJ to about 1.0 mJ, or more preferably in the range from 1.0 to 10 µJ. The pulse repetition rate (rep rate) ranges from about 75 kHz to about 1 MHz, or more preferable in the range from about 100 kHz to about 800 kHz. The focal spot size typically ranges from less than one µm to about 5 µm. The focal spot location can range from about 100 µm below the surface to about 100 µm above the surface, or more preferably in the range from about 30 µm below the surface to about 30 µm above the surface. Beam speed is typically in the range from about 10 mm/s to about 500 mm/s, or more preferably in the range from about 120 mm/s to about 380 mm/s.

Embodiments of this invention employ a laser scribing system which uses a laser to emit pulses with selected pulse energy and pulse duration at a selected pulse repetition rate. The laser processing system uses laser optics which select and optionally shape the laser pulses spatially and temporally. The laser pulses are focused to a very small spot size in order to concentrate sufficient laser energy in a small enough area to alter the materials in a desirable fashion. The focal spot is defined as the point in space where the laser pulse has the smallest cross-section perpendicular to the direction of propagation of the pulses. The laser scribing system includes a z-axis stage as part of the motion control stage which precisely locates the focal spot a selected height above or below the surface of the substrate. The laser processing system also has a combination of beam steering optics and motion control stages which move the substrate in relation to the laser pulses as the laser is pulsing thereby removing or altering material in a pattern determined by the relative motion. The rate at which the laser pulses move relative to the substrate is called beam speed and is measured in millimeters per second.

Figure 2:
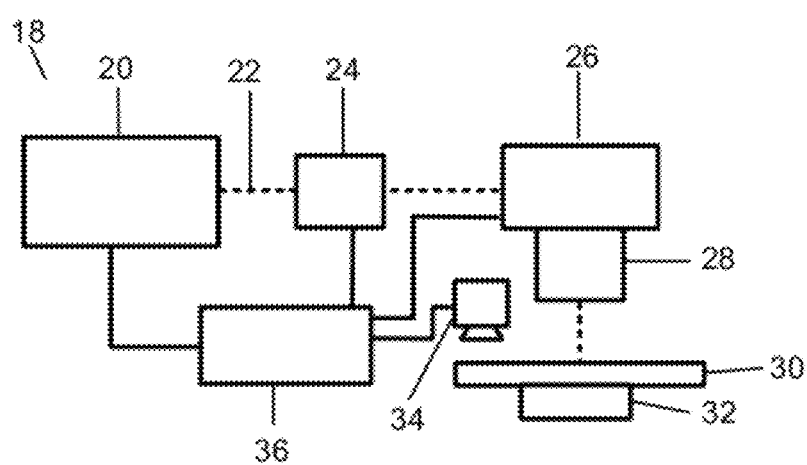
FIG. 2 Adapted laser scribing system
FIG. 3 Backside coating removal.

An exemplary laser scribing system which may be adapted to perform aspects of this invention is the AccuScribe 2600 LED Laser Scribing System, manufactured by Electro Scientific Industries, Inc., Portland, Oreg. 97239, shown in FIG. 2. The laser scribing system 18 includes a laser 20 which emits laser pulses 22 along a laser beam path. The laser pulses 22 are processed by laser beam optics 24 which select and shape the laser pulses 22. The laser beam optics 24 may contain electro- or acusto-optic elements which select and direct the laser pulses. The laser beam optics may also contain optical elements that shape the laser pulses both spatially or temporally. The laser pulses 22 then are passed to the beam steering optics 26 which provide fast, limited motion steering of the laser pulses with respect to the substrate 30. The laser pulses 22 are then typically focused on the substrate 30 by the field optics 28. The substrate 30 is fixture on a motion control chuck 32 which holds the substrate 30 and moves it in relation to the laser pulses 22 under direction of a controller 36 which coordinates the operations of the laser 20, laser beam optics 24, beam steering optics 26 and the alignment camera 34, which visually aligns the substrate 30 with respect to the laser pulses 22.

One of the adaptations made is fitting a solid state IR laser model Duetto manufactured by Time-Bandwidth Products AG, CH-8005 Zurich, Switzerland. This laser emits 10 ps pulses at 1064 nm wavelength which are frequency-doubled using a solid-state harmonic generator to 532 nm wavelength and optionally frequency tripled using a solid-state harmonic generator to 355 nm wavelength. These lasers have output power of 0.1 to 1.5 Watts.

Aspects of this invention scribe substrates by first attaching the substrate frontside to a tape frame with die attach film (DAF) and inserting the attached substrate 30 into the system 18. The system aligns the substrate 30 using the alignment camera 34 so as to be able to aim the laser pulses 22 to scribe the substrate 30 on the backside while maintaining alignment with the streets on the frontside. A laser scribing system 18 typically processes a substrate 30 by directing a pulsed laser beam 22 to the substrate 30 while moving the laser pulses 22 with respect to the wafer 30 using the motion control stage 32 and beam steering optics 26 so as to cause the laser pulses 22 to impact the substrate 30 along a path determined by the speed and direction of the relative motion. For efficiency it is typically best to process the substrate in passes, where the system starts processing with the pulsed laser beam while moving the relative location of the laser beam with respect to the substrate in a relatively continuous fashion, typically starting once and stopping once per pass. Aspects of this invention scribe the substrate by making multiple linear passes on the backside of the substrate in orthogonal directions aligned with the frontside streets, although any pattern of curvilinear or straight lines can be scribed.

Aspects of this invention scribe substrates using one or more passes per scribe. In some instances, the thickness of the substrate and layout of active circuitry on the frontside permits enough laser fluence per unit time to be delivered to the substrate backside to remove the backside coating and form a scribe in a single pass without causing damage. In most instances, however, applying enough laser energy to remove the backside coating and form a scribe in a single pass results in undesirable damage to the substrate or device. In this instance more than one pass is required with laser pulse parameters being altered depending upon whether the backside coating is being removed or the scribe is being formed. Embodiments of this invention use one or more passes to remove the backside coating and then one or more passes to form the scribe.

Figure 3:
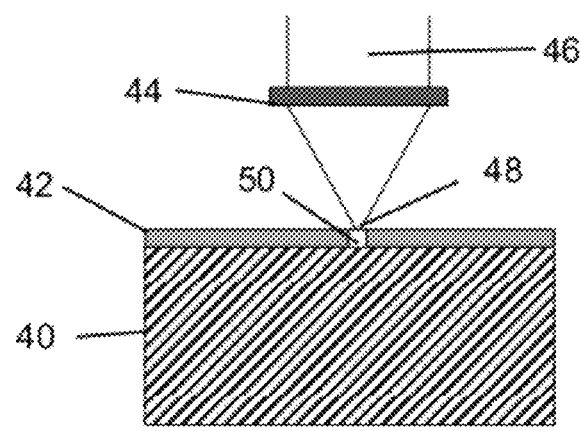
Figure 4:
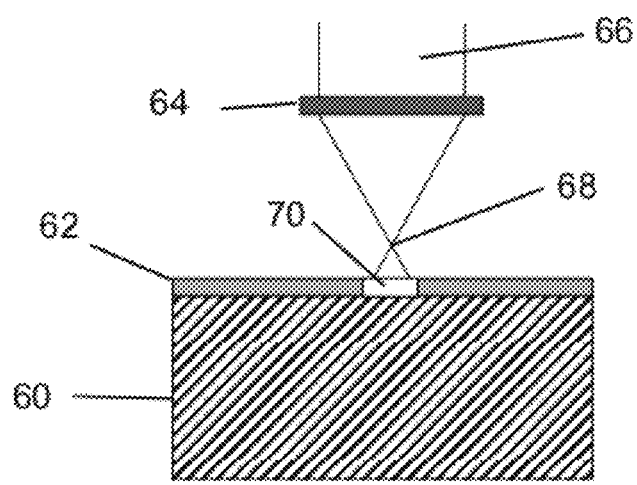
FIG. 4 Backside coating removal.
Figure 5:
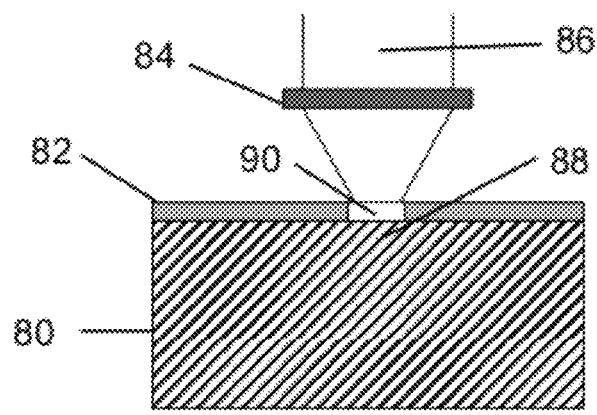
FIG. 5 Scribe
FIG. 6 Backside coating removal and scribe.

Laser pulse parameters are predetermined to process the substrate efficiently without causing damage to the substrate or devices. Laser parameters which may be predetermined include wavelength, pulse duration, pulse energy, laser power, pulse repetition rate, focal spot size, focal spot location and beam speed. These parameters are typically determined empirically for a particular substrate and device type to process the substrate with maximum throughput while avoiding damage to the substrate or devices. Along with the optimal laser pulse parameters the number of passes to be used to process the substrate is determined. The number of passes is determined by how much laser fluence is can be used per unit time without causing damage to the substrate or devices. Depending upon the laser energy permitted the backside coating may be removed in one pass as shown in FIGS. 3, 4. FIG. 3 shows a substrate 40 with a backside coating 42. Laser pulses 46 are focused by a lens 44 to a focal spot 48 which is directed at the surface of the backside coating 42 to remove the backside coating 42 in a particular location 50. FIG. 4 shows a substrate 60 with a backside coating 62. Laser pulses 66 are focused by a lens 64 to a focal spot 68 which is directed to a location above the substrate 60 and backside coating 62 to remove backside coating 62 in a region 70. When the laser pulses 66 are focused 68 above or below the surface of the substrate it has the effect of defocusing the laser pulses and spreading the laser pulse energy over a larger area. This not only increases the area of material removed per pulse, thereby speeding up the process but also decreases the laser fluence per unit time thereby avoiding damage. FIG. 5 shows a substrate 80 with a backside coating 82. Laser pulses 86 are focused by lens 84 to a focal spot 88 which is located within the substrate 80 to remove the backside coating 82 in a region 90. As in FIG. 4, moving the focal spot 88 below the surface of the substrate 80 defocuses the laser pulses and spreads the energy over a larger area thereby decreasing fluence and limiting undesirable damage.

Table 1 shows exemplary laser parameters used by an embodiment of this invention to remove backside coating from a 140 µm thick sapphire substrate. This substrate did not have active circuitry near the region to be scribed or Gallium Nitride (GaN) layers on the frontside and therefore the backside coating could be processed with enough energy to remove the backside coating in one pass. This embodiment removes the backside coating in one pass by focusing the laser pulses 30 microns below the surface of the backside coating.

TABLE 1

Laser pulse parameters for one pass backside coating removal

| | |
|---|---|
| Pulse Duration | 10 ps |
| Laser Power | 1.2 W |
| Stage Speed | 120 mm/s |
| Rep Rate | 200 kHz |
| Focal Spot Size | 1-5 µm |
| Focal Spot Location | −30 µm |
| # Passes | 1 |

In other cases, for example where for example GaN is present on the frontside, multiple passes may be required. Table 2 shows laser parameters used to remove backside coating on substrates with thicknesses between 120 and 140 µm. Laser power used is 0.7 W for 120 µm thick substrates and 0.8 W for 140 µm thick substrates. Stage speed is 120 mms/s for 140 µm thick substrates and 180 mm/s for 120 µm thick substrates. This embodiment removes the backside coating with three passes along the same path focused at the surface of the backside coating, 7 µm below the surface and 15 µm below the surface

TABLE 2

Laser pulse parameters for vertical multi-pass backside coating removal

| | |
|---|---|
| Pulse Duration | 10 ps |
| Laser Power | 0.7-0.8 W |
| Stage Speed | 120-180 mm/s |
| Rep Rate | 200 kHz |
| Focal Spot Size | 1-5 µm |
| Focal Spot Location | 0, −7, −15 µm |
| # Passes | 3 |

Figure 6:
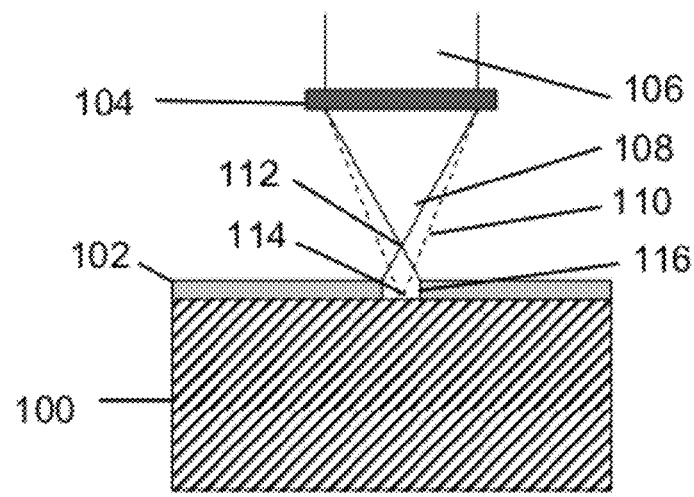

FIG. 6 shows an embodiment of this invention which employs two laser pulse beams to process a substrate 100 in one pass. A substrate 100 with a backside coating 102, is illuminated by two laser pulse beams 106 focused by a common lens 104 on a common optical axis. First laser beam pulses 108 are focused to a point above the substrate 112 to remove the backside coating 102 in an area 116. The second laser pulses 110 are focused on the surface of the substrate 114 to form the scribe. When these two laser pulse beams are moved together along a path at preselected rates a substrate with a backside coating can be scribed in a single pass without causing damage to the substrate or active circuitry.

Figure 7:
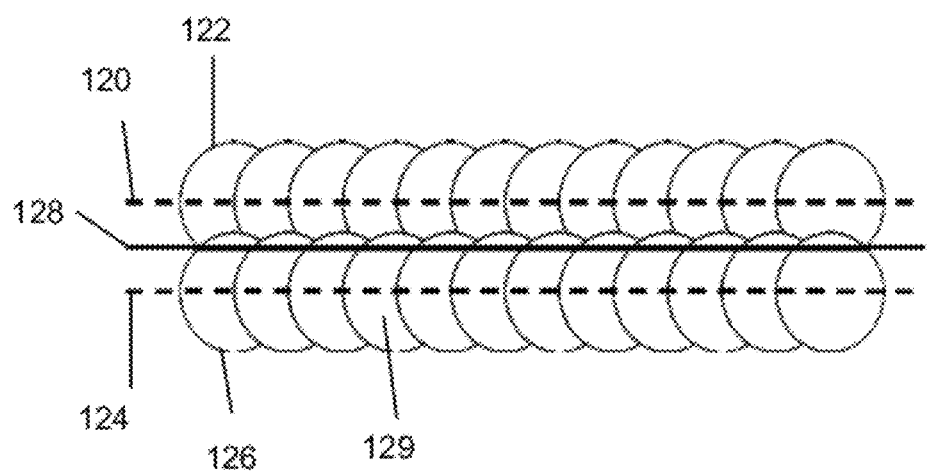
FIG. 7 Multi-pass backside coating removal with scribe.

FIG. 7 shows backside coating removal using linear motion to remove backside coating in an area larger than the width of a single pass by laser pulses. In this case, a substrate with a backside coating has the backside coating removed along linear regions with one or more passes made at the same height with respect to the substrate. In FIG. 7, a substrate with a backside coating (not shown) is to be scribed along line 128. Prior to scribing the backside coating is removed in a linear region 139 described by the overlapping laser pulses 122 opposite the frontside street (not shown) by making a pass on the substrate along dotted line 120, impacting the coated substrate with overlapping laser pulses, one of which is indicated 122 at fluence which removes the coating without causing damage. The substrate is then indexed by the motion control stages (not shown) to permit another pass to be made along dotted line 124, where the laser pulses again impact the coated substrate with overlapping pulses, one of which is indicated 126. These two passes remove the backside coating without damage to the substrate or active circuitry. The substrate is then indexed to a position where the laser pulses will impact the substrate along line 128 as the substrate is moved with respect to the laser pulse beam. Laser parameter are adjusted to scribe rather than remove backside coating and a third pass is made along line 128 thereby scribing the substrate without causing damage to the underlying substrate or active circuitry. Exemplary laser pulse parameters for this embodiment are given in Tables 3 and 4. Laser power is 0.7 W for 120 μm thick substrates and 0.8 W for 140 μm thick sapphire substrate. Stage speed is 180 mm/s for 120 μm thick sapphire substrates and 120 mm/s for 140 μm thick sapphire substrates.

TABLE 3

Laser pulse parameters for horizontal multi-pass backside coating removal.

| | |
|---|---|
| Pulse Duration | 10 ps |
| Laser Power | 0.7-0.8 W |
| Stage Speed | 120-180 mm/s |
| Rep Rate | 200 kHz |
| Focal Spot Size | 1-5 μm |
| Focal Spot Location | 35 μm |
| # Passes | 2, 20 μm separation |

Following backside coating removal in this fashion, the substrate may be scribed with a single pass with the laser pulses focused 20 microns below the surface of the substrate with the parameters as shown in Table 4. Multiple scribing passes may also be used.

TABLE 4

Laser pulse parameters for single-pass scribing.

| | |
|---|---|
| Pulse Duration | 10 ps |
| Laser Power | 0.6 W |
| Stage Speed | 120-180 mm/s |
| Rep Rate | 200 kHz |
| Focal Spot Size | 1-5 μm |
| Focal Spot Location | −15 μm |
| # Passes | 1 |

Table 5 shows laser pulse parameters for embodiments of this invention that employ multiple passes to scribe the substrate following removal of the backside coating. This is used in cases where using sufficient energy to scribe the substrate in one pass would cause damage to the substrate or active circuitry. In this case, the substrate is scribed by making two or more passes along the same path varying the focal spot location with respect to the surface of the substrate. Scribing a substrate in this fashion creates an altered region beginning at the surface of the substrate and extending into the interior which promotes and directs subsequent cleaving.

TABLE 5

Laser pulse parameters for multi-pass scribing.

| | |
|---|---|
| Pulse Duration | 10 ps |
| Laser Power | 0.6 W |
| Stage Speed | 120-180 mm/s |
| Rep Rate | 200 kHz |
| Focal Spot Size | 1-5 μm |
| Focal Spot Location | −7, −15 μm |
| # Passes | 2 |

Figure 8:
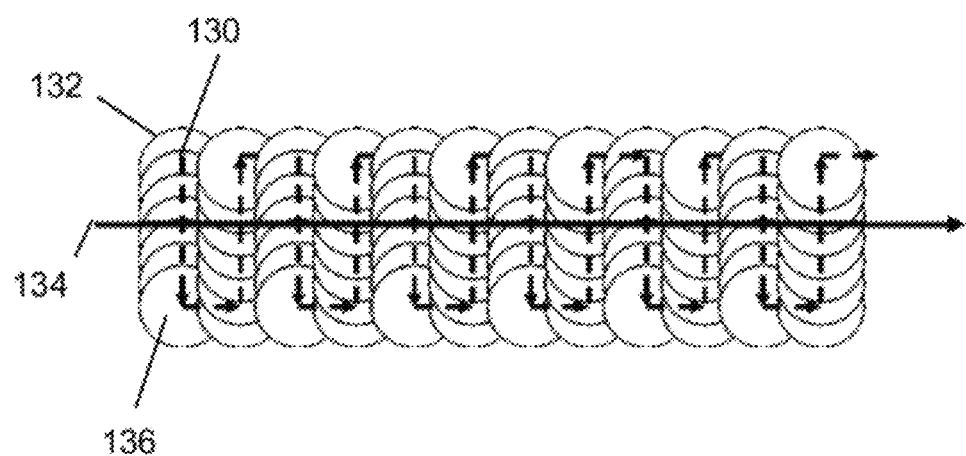
FIG. 8 Multi-pass backside coating removal with scribe.

FIG. 8 shows an embodiment of this invention which employs fast beam steering optics to deliver laser pulses to the substrate in patterns which efficiently remove backside coatings. In this embodiment, laser pulses, one of which is shown 132 are directed to the substrate (not shown) along a dotted line 130 which is determined by the combined relative motion of the laser pulses with respect to the substrate caused by moving the substrate in a linear fashion with motion control stages while moving the laser pulses with laser beam steering optics. In FIG. 8, the combined motion control/beam steering optics (not shown) moves the laser in the pattern shown by dotted line 130 while delivering laser pulses 132 to the substrate. One or more passes may be required to completely remove the backside coating in the linear region 136 opposite the frontside streets described by the overlapping pulses 132 without causing damage to the substrate or active circuitry. Following the backside coating removal the substrate is scribed 134 in the region 136 where the backside coating has been removed. One or more passes may be required to scribe the substrate without causing damage to the substrate or active circuitry.

It will be apparent to those of ordinary skill in the art that many changes may be made to the details of the above-described embodiments of this invention without departing from the underlying principles thereof. The scope of the present invention should, therefore, be determined only by the following claims.

We claim:

1. An improved method for scribing opto-electric devices on a substrate with a laser scribing system, said substrate having a frontside, said frontside having streets and a backside, said backside having a surface having a coating, said improvements comprising:

providing said laser scribing system with an ultrafast pulsed laser having first and second laser pulse parameters;

removing said coating from said backside surface of said substrate in regions generally aligned with said frontside streets of said substrate using said ultrafast pulsed laser and said first laser pulse parameters without causing substantial damage to said substrate, and scribing regions of said backside surface of said substrate where said coating is removed using said ultrafast pulsed laser and said second laser pulse parameters;

wherein said step of removing said coating from said backside surface of said substrate is performed prior to a step of dividing said substrate into individual devices.

2. The method of claim 1 wherein said substrate is one of sapphire, silicon, germanium, diamond, or ceramic.

3. The method of claim 1 wherein said ultrafast pulsed laser is one of a fiber laser, diode-pumped solid state laser or gas laser.

4. The method of claim 1 wherein said first and second laser pulse parameters include a wavelength equal to or less than about 560 nm.

5. The method of claim 1 wherein said first and second laser pulse parameters include laser power of between about 0.5 W and about 10 W.

6. The method of claim 1 wherein said first and second laser pulse parameters include a pulse repetition rate between about 75 kHz and about 1,000 kHz.

7. The method of claim 1 wherein said first and second laser pulse parameters include a scan speed of between about 75 mm/s and about 500 mm/s.

8. The method of claim 1 wherein said first laser pulse parameters include a focal spot offset of about 0 μm and one pass.

9. The method of claim 1 wherein said second laser pulse parameters include focal spot offsets of between about 0 and about −30 μm and two passes.

10. The method of claim 1 wherein said first laser pulse parameters include a focal spot offset of between about 15 μm and about 50 μm and two passes.

11. The method of claim 1 wherein said second laser pulse parameters include a focal spot offset of between about 0 μm and about −30 μm and one pass.

12. An improved system for scribing opto-electric devices on a substrate with a laser scribing system, said substrate having a frontside, said frontside having streets and a backside, said backside having a surface having a coating, said improvements comprising:

an ultrafast pulsed laser having first and second laser pulse parameters wherein said first laser pulse parameters remove said coating from said backside surface of said substrate in regions generally aligned with said frontside streets prior to dividing said substrate into individual devices and said second laser pulse parameters scribe said backside surface of said substrate where said coating is removed.

13. The system of claim 12 wherein said substrate is one of sapphire, silicon, germanium, diamond, or ceramic.

14. The system of claim 12 wherein said ultrafast pulsed laser is one of a fiber laser, diode-pumped solid state laser or gas laser.

15. The system of claim 12 wherein said first and second laser pulse parameters include a wavelength equal to or less than about 560 nm.

16. The system of claim 12 wherein said first and second laser pulse parameters include laser power of between about 0.1 W and about 10 W.

17. The system of claim 12 wherein said first and second laser pulse parameters include a pulse repetition rate between about 75 kHz and 1,000 kHz.

18. The system of claim 12 wherein said first and second laser pulse parameters include a scan speed of between about 20 mm/s and about 500 mm/s.

19. The system of claim 12 wherein said first laser pulse parameters include a focal spot offset of about 0 μm and one pass.

20. The system of claim 12 wherein said second laser pulse parameters include focal spot offsets of between about 0 and about −30 μm and two passes.

21. The system of claim 12 wherein said first laser pulse parameters include a focal spot offset of between about 15 μm and about 50 μm and two passes.

22. The system of claim 12 wherein said second laser pulse parameters include a focal spot offset of between about 0 μm and about −30 μm and one pass.

* * * * *